United States Patent
Shinohara et al.

(10) Patent No.: US 6,172,427 B1
(45) Date of Patent: *Jan. 9, 2001

(54) ELECTRIC ENERGY SUPPLY SYSTEM FOR VEHICLE

(75) Inventors: Kazuhiko Shinohara, Yokohama; Masakazu Kobayashi, Kanagawa; Kenji Furuya, Yokohama; Keiko Kushibiki, Kanagawa, all of (JP)

(73) Assignee: Nissan Motor Co., Ltd., Kanagawa (JP)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/022,496

(22) Filed: Feb. 12, 1998

(30) Foreign Application Priority Data

Feb. 13, 1997 (JP) .................................... 9-029385

(51) Int. Cl.⁷ ................................ F02N 11/06; H02P 9/04
(52) U.S. Cl. ...................... 290/40 B; 290/4 R; 290/4 A; 290/4 C; 290/40 A; 290/40 C; 290/40 F
(58) Field of Search ............................ 60/597, 39.5, 598; 290/40 F, 45, 17; 180/65.1, 65.2

(56) References Cited

U.S. PATENT DOCUMENTS

| 4,769,993 | * | 9/1988 | Kawamura | 60/597 |
| 4,833,887 | | 5/1989 | Kawamura et al. | 60/600 |
| 4,864,151 | * | 9/1989 | Wyczalek et al. | 290/52 |
| 4,886,978 | * | 12/1989 | Kawamura | 290/52 |
| 5,786,640 | * | 7/1998 | Sakai et al. | 290/17 |
| 5,847,470 | * | 12/1998 | Mitchell | 290/45 |
| 5,857,336 | * | 1/1999 | Paul et al. | 60/597 |
| 5,893,423 | * | 4/1999 | Selfors et al. | 180/65.2 |
| 5,907,191 | * | 5/1999 | Sasaki et al. | 290/19 |

FOREIGN PATENT DOCUMENTS

| 0 094 685 A2 | 11/1983 | (EP) | 60/608 |
| 0 311 457 A1 | 4/1989 | (EP) . | |
| 0 420 705 A1 | 4/1991 | (EP) . | |
| 0 570 242 A1 | 11/1993 | (EP) | 60/608 |
| 0 709 559 A1 | 5/1996 | (EP) . | |
| 0 725 473 A2 | 8/1996 | (EP) . | |
| 0 791 735 A1 | 8/1997 | (EP) . | |
| 61-254082 | 11/1986 | (JP) . | |
| 63-262075 | 10/1988 | (JP) . | |
| 5-111101 | 4/1993 | (JP) . | |

* cited by examiner

Primary Examiner—Elvin Enad
(74) Attorney, Agent, or Firm—McDermott, Will & Emery

(57) ABSTRACT

An electric energy supply system for a vehicle includes a power output shaft electric power generation unit and an exhaust gas electric power generation unit for generating electric power by utilizing a power energy and an exhaust gas energy. A storage battery, a driving condition judgment unit for judging a driving condition of the vehicle, an electricity storage condition judgment unit for judging an electricity storage condition of the storage battery, and an electric power control unit for controlling a supply amount of electric energy to be used in the vehicle are provided. Under the control of the electricity power control unit, the amount of electric power generated by each of the power output shaft electric power generation unit and the exhaust gas electric power generation unit is controlled in accordance with information obtained from the driving condition judgement unit and the electricity storage condition judgement unit. This recovers energy released from the engine in dependence on the tuning mode of the vehicle, and thereby reduces fuel consumption.

14 Claims, 3 Drawing Sheets

ELECTRIC ENERGY SUPPLY SYSTEM FOR VEHICLE

FIELD OF THE INVENTION

The present invention relates to an electric energy supply system for a vehicle on which a driving source such as an internal combustion engine is mounted, and particularly to the electric energy supply system which makes it possible to effectively use exhaust gas energy or the like discharged from the internal combustion engine of an automotive vehicle and reduce the amount of fuel used for the engine thereby improving energy efficiency.

BACKGROUND OF THE INVENTION

An alternator is mounted on a vehicle to supply power to an electric load of the vehicle and to charge a storage battery in accordance with an electricity storage condition, using the power output shaft of the engine as a power source. The output of this alternator depends on the rotational speed of a rotor and an electric power demand. Accordingly, electric power is generated when the electric power demand increases even during acceleration of the vehicle, and therefore the driving force from the power output shaft of the engine is required. This further increases the load energy required for acceleration of the vehicle. During deceleration of the vehicle, little electric power is generated under some electric power using conditions, and the kinetic energy of the vehicle is dissipated as brake heating and the like and as pumping loss of the engine.

The electric power demands for a vehicle in recent years has increased due to the addition of electrical equipment such as an anti-braking system (ABS), a four-wheel drive system (4WS), a traction control system (TRC), a power steering system (PS) and the like. In order to supply sufficient electric power to satisfy this increased demand, the capacity of the alternator tends to increase; however, the efficiency of the alternator is around 50% at maximum.

In general, the energy which can be taken out from the power output shaft of the engine is around 30% of the energy contained in fuel in an automotive vehicle having a gasoline-fueled engine. The energy necessary for the normal running of the vehicle is similarly around 25%. In contrast, when the maximum electric power generation is made using the alternator having, an electric power generation capacity of 1 kW, for example, 2 to 3 kW of the energy to be used for running of the vehicle is consumed by the electric power generation of the alternator. This corresponds to about 6 to 9% of the energy contained in gasoline fuel. Accordingly, the fuel economy is degraded 19 to 26% at maximum electric power generation.

In order to improve the electric power supply in such a vehicle, an electric power supply source which is used in addition to the conventional alternator and does not use the power output shaft of the engine as an energy source, or a control manner for the electric power obtained by this are proposed in Japanese Patent Provisional Publication 61-254082, Japanese Patent Provisional Publication No. 63-262075 and Japanese Patent Provisional Publication No. 5-111101. Of these, both the electric power supply sources disclosed in Japanese Patent Provisional Publication No. 61-254082 and Japanese Patent Provisional Publication No. 63-262075 use an exhaust gas heat electric power generation device which converts the thermal energy of exhaust gas discharged from an internal combustion engine to electric energy. This exhaust gas heat electric power generation device includes a heat absorption section in contact with exhaust gas, a cooling section in contact with outside air or liquid, and a thermoelectric converter element interposed between the heat absorption section and the cooling section to convert to electric energy the thermal energy due to a temperature difference.

Additionally, the electric power supply source and the electric power control method disclosed in Japanese Patent Provisional Publication No. 5-111101 is provided with a solar electric power generating means for converting solar energy to electric energy, in addition to thermoelectric converting means for converting exhaust gas thermal energy from the engine to electric energy as mentioned above. During the running and idling of the vehicle, exhaust gas thermal energy from the engine is converted to electric energy to be stored in a storage battery by using the thermoelectric converting means. When the vehicle is located outside, solar energy is converted to electric energy to be stored in the storage battery by using the solar electric energy generating means. The stored energy is utilized as energy for driving auxiliary electrical equipment parts, accessories, and the like.

Applying the above-described exhaust gas heat electric power generation device theoretically contributes to fuel economy improvements. However, since the amount of electric power generation is around 100 W, it is impossible to satisfy the electric power requirements of the vehicle only with the exhaust gas heat electric power generation device.

Additionally, the reduction in fuel consumption is as small as around 5% merely by using, as an energy for driving accessories and the like, the electric power obtained by the electric power supply source other than the alternator, such as the thermoelectric converting means utilizing exhaust gas heat and the solar electric power generating means utilizing sunlight. Thus, the conventional techniques are relatively ineffective in improving fuel economy improvement and therefore are not practical.

In view of the above-described conventional techniques, there is a need for an electric energy supply system for a vehicle, which can reduce fuel consumption in all vehicle driving modes by controlling the amount of generated electric power obtained from a variety of electric power generating sources, in accordance with the driving condition of the vehicle and the electricity storage condition of a storage battery.

This and other needs are met by the present invention, which provides an electric energy supply system for a vehicle, comprising a plurality of electric power generators for generating electric power by utilizing different energies which can be taken out from a driving source for driving the vehicle. Electricity storing devices are provided for storing electric energy. Driving condition judging means judge a driving condition of the vehicle and electricity storage condition judging means judges an electricity storage condition within the electricity storing means. Electric power controlling means for control a supply amount of electric energy to be used in the vehicle. The controlling means is configured to control an amount of electric power generated by each of the plurality of the electric power generating sources in accordance with information obtained from the driving condition judging means and the electricity storage condition judging means.

In certain embodiments of the invention, the driving source includes an internal combustion engine, and the plurality of the electric power generators includes a power output shaft electric power generator for generating electric power by utilizing a power energy obtained from the internal combustion engine, and an exhaust gas electric power generator for generating electric power by utilizing exhaust gas energy of the internal combustion engine.

The exhaust gas electric power generator includes a thermoelectric generator for generating electric power by utilizing a heat energy of exhaust gas discharged from the internal combustion engine, in certain embodiments of the present invention. In further embodiments of the invention, the exhaust gas electric power generator includes a turbine generator for generating electric power by utilizing kinetic energy of exhaust gas discharged from the internal combustion engine.

Additionally, in an electric energy supply system for a vehicle according to certain embodiments of the present invention, the electric power controlling means is configured to operate the exhaust gas electric power generating means as a main generating source to generate electric power and to supply an electric energy obtained by this electric power generation to the electricity storing means and to an electric power load within the vehicle, when the vehicle is in an acceleration condition that is detected by the driving condition judging means.

The present invention, in certain embodiments, has the electric power controlling means configured to operate the power output shaft electric power generating means as a main generating source to generate electric power and to supply an electric energy obtained by this electric power generation to the electricity storing means and to an electric power load within the vehicle, when the driving condition judging means detects that the vehicle is in an acceleration condition.

Certain embodiments of the present invention provide detecting means for detecting an electric power generating ability of the exhaust gas electric power generator, in which the electric power controlling means is configured to operate the power output shaft electric power generator as a main generating source when the electric power generating ability detected by the detecting means is not higher than a predetermined level.

One of the advantages of the present invention is that by controlling the amount of electric power generated by each of the plurality of the electric power generators in accordance with the driving condition of the vehicle and the electricity storage condition of the storage battery, the energy released from the driving source of the vehicle can be recovered without waste so as to be effectively utilized as electric energy. The invention largely reduces energy consumption in the driving source.

Another advantage is that the kinetic energy and the exhaust gas energy obtained from the internal combustion engine is effectively recovered in accordance with the running modes of the vehicle and the electricity storage condition of the electricity storing means so as to be utilized as electric energy. The fuel to be consumed in the internal combustion engine can be reduced, thereby attaining improvements in fuel economy.

Additionally, the thermal energy of exhaust gas discharged from the internal combustion engine can be recovered by the relatively simple construction of certain embodiments of the invention, thereby not only attaining the fuel economy improvement but also making the improvement practical.

According to certain embodiments of the electric energy supply system for a vehicle, since the turbine generator utilizing the kinetic energy of exhaust gas discharged from the internal combustion engine is used, energy to be discharged can be effectively recovered to attain improvements in fuel economy even though exhaust gas is at a relatively low temperature, if the engine speed is high and the speed of exhaust gas is high. This is especially advantageous under a running mode in which the temperature of exhaust gas is low at a time immediately after engine starting.

In certain embodiments the present invention, when the vehicle is in an acceleration condition, the discharged energy from the engine is recovered and converted into electric energy by the exhaust gas electric power generator. This converted electric energy is supplied to the electricity storing means, or otherwise satisfies the electric load in the vehicle. In other words, since the energy amount contained in exhaust gas is large during acceleration of the vehicle, the electric power to be required for the vehicle can be sufficiently satisfied by electric power generation just by the exhaust gas electric power generation. It is therefore unnecessary to generate electric power through operation of the power output shaft electric power generator which requires the shaft output of the internal combustion engine. By the synergistic effect provided in the present invention, the fuel to be consumed is reduced thereby offering improvements in fuel economy. Particularly, the energy used by the conventional alternator is about 6 to 9% of the energy amount contained in fuel. With the present invention, a fuel economy improvement of 19 to 26% at maximum is attained, in a condition where the alternator is not operated.

According to the electric energy supply system for a vehicle, according to certain embodiments, when the vehicle is in a deceleration condition, the shaft output (kinetic energy) of the internal combustion engine is recovered by the power output shaft electric power generator and converted into electric energy. This converted electric energy is supplied to the electricity storing means, or otherwise satisfies an electric load in the vehicle. In other words, since the energy amount contained in exhaust gas is excessively reduced during deceleration of the vehicle, recovery of energy cannot be sufficiently accomplished under electric power generation only with the exhaust gas electric power generator. However, the present invention provides for recovery as electric energy the vehicle kinetic energy which has been hitherto released as engine brake or frictional heat due to operation of a brake pedal.

According to the certain embodiments of the invention, when there arises, for example, an abnormality or a deterioration in the exhaust gas electric power generator, electric power generation can be accomplished by operating the power output shaft electric power generator as a main electric power generating source. This can stably supply an electric power required for the vehicle, thereby improving the reliability of the electric energy supply system.

The foregoing and other features, aspects and advantages of the present invention will become more apparent from the following detailed description of the present invention when taken in conjunction with the accompanying drawings.

DETAILED DESCRIPTION OF EXEMPLARY EMBODIMENTS

Figure 1:
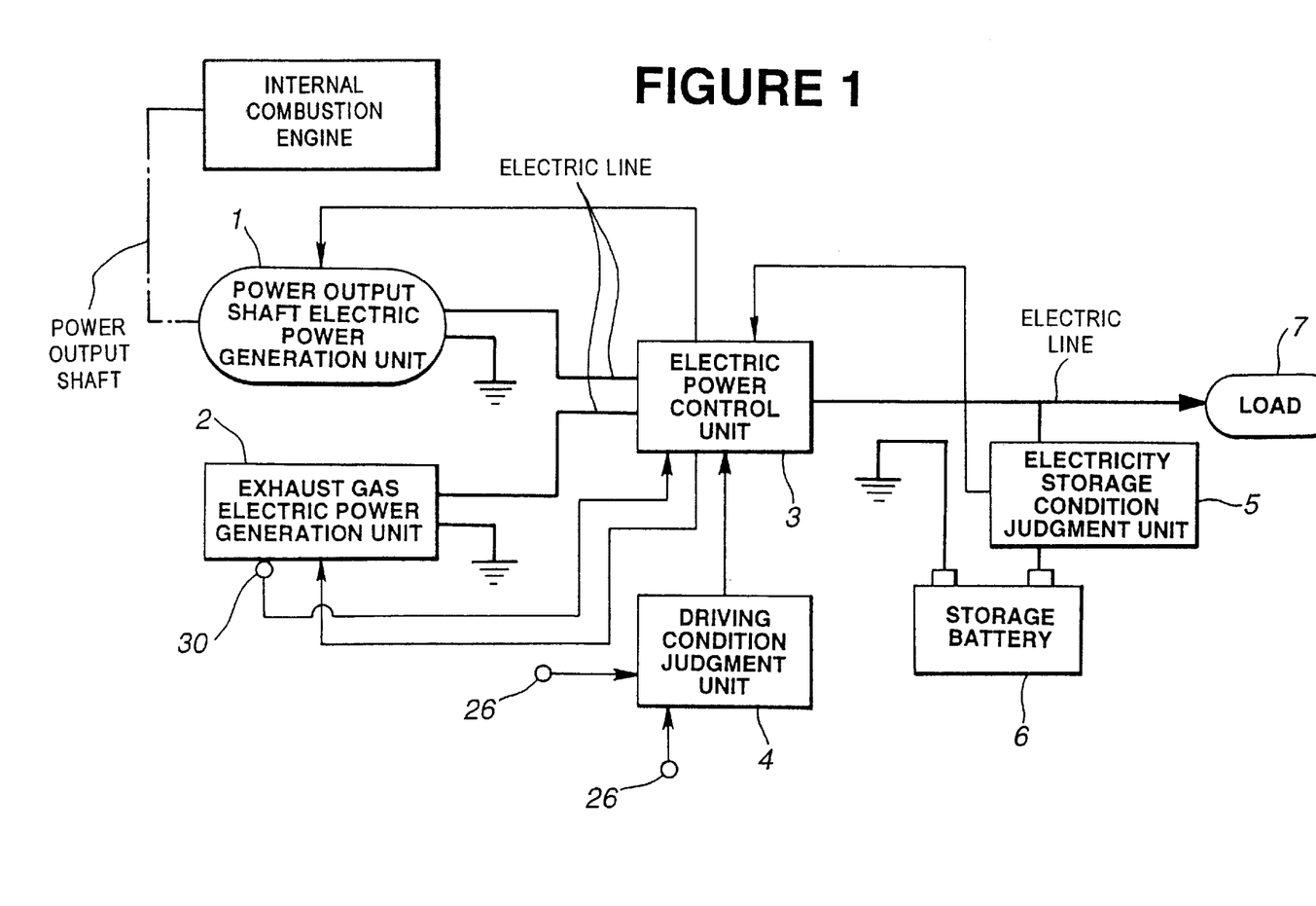
FIG. 1 is a block diagram of an electric energy supply system of a vehicle, according to an embodiment of the present invention.

FIG. 1 is a block diagram showing a general arrangement of the electric energy supply system for a vehicle, according to the present invention. This supply system comprises a power output shaft power generation unit 1, serving as an electric power generator drivingly connected to a power output shaft of an engine through a gear, a belt or the like. An exhaust gas electric power generator unit 2 serves as an electric power generator for deriving electric energy from an exhaust gas energy of the engine. A driving condition judgment unit 4 serves as a vehicle driving condition judging means. An electric power control unit 3 serves as electric power controlling means for controlling an electric power generated by each electric power generating means in accordance with an electric power amount to be used in the vehicle and on the basis of information obtained from an electricity storage condition judgment unit 5 serving as electricity storage condition judging means for judging an electricity storage amount of a storage battery. The storage battery 6 serves as an electricity storing means which can accumulate electric power obtained from each electric power generating means.

In an exemplary embodiment, an alternator is used as an example of the output shaft electric power generation unit serving as one of the electric power generating means. This alternator 1 has self-current limiting characteristics, in which its maximum output current is generally designed within a range where the alternator cannot burn, and therefore it is unnecessary to provide a current limiting regulator. However, the current obtained by this alternator is alternating, and therefore it is necessary to rectify the current to obtain a constant-voltage in order to convert the current to electric power which can be used for the vehicle. In view of this, a voltage regulator is generally incorporated integrally in the alternator; however, this function may instead be incorporated in the electric power control unit 3. The alternator 1 is adapted to be able to control its electric power generating amount by controlling its induced current.

The output shaft electric power generation unit 1 serving as the output shaft electric power generating means is not limited to the above-mentioned alternator. For example, in other embodiments it is an induction generator which is separately disposed and adapted to generate electric power by using a power energy obtained from the power output shaft of the engine. The output shaft electric power generation unit 1 may be a single unit that combines an alternator and an induction generator.

The exhaust gas electric power generation unit 2 serving as one of the electric power generators is a turbine generator 2a, in certain embodiments. The turbine generator 2a (see FIG. 4) is installed in an exhaust gas pipe of the engine and adapted to rotate a turbine by kinetic energy of exhaust gas of the engine. In other embodiments, the exhaust gas power generator unit 2 is a thermoelectric generator 2b which includes a plurality of thermoelectric converter element couples and is adapted to generate electric power by employing the Seebeck effect due to a temperature difference between a high temperature source and a low temperature source. The heat energy of exhaust gas is used as the high temperature source while outside air or another medium is used as the low temperature source. In still further embodiments, the exhaust gas power generation unit 2 is provided with both the turbine generator and the thermoelectric generator.

Figure 2:
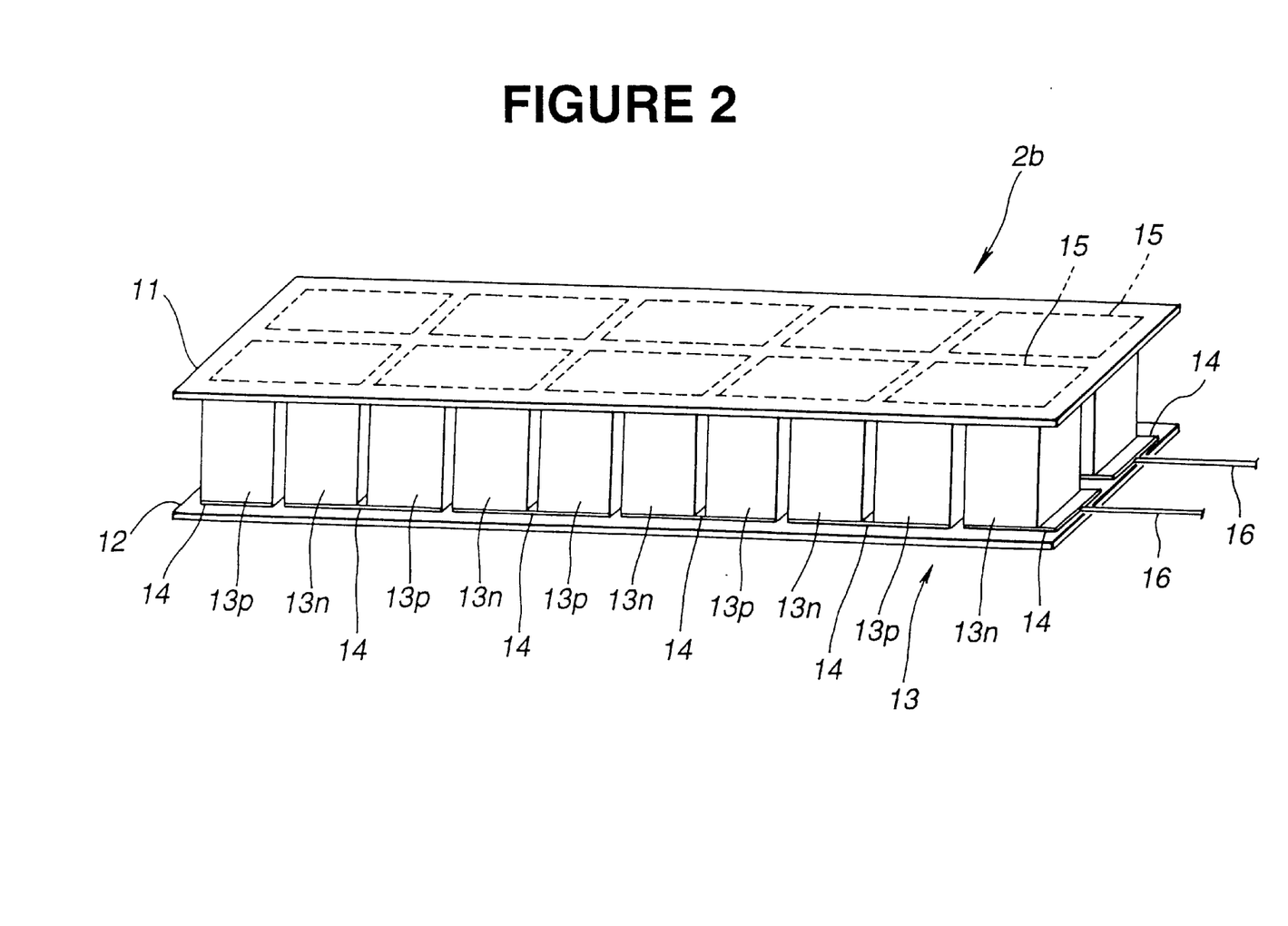
FIG. 2 is a perspective exterior view of a thermoelectric generator forming part of the electric energy supply system of a vehicle, according to an embodiment of the present invention.

The thermoelectric generator will be discussed in greater detail below. FIG. 2 is a perspective view showing a part (a module) of the thermoelectric generator 2b. As shown in this figure, the thermoelectric generator 2b includes a high temperature-side base plate 11 for effectively absorbing heat of the exhaust gas of the engine; a low temperature-side base plate 12 which is located at a low temperature end-side and cooled by water or air; electrodes 14, 15; and lead wires 16.

Each thermoelectric converter element couple 13 includes, for example, a pair formed by a N-type semiconductor element $13_N$ and a P-type semiconductor element $13_P$. Ten pairs of the elements $13_N$, $13_P$ are connected in series with each other to form the module serving as one electric power generation unit within the exhaust gas power generation unit 2. In certain embodiments, the thermoelectric generator 2b includes 100 units of such electric power modules which are combined in series with each other. Examples of the material of the thermoelectric converting element 13 are a crystal and a sintered body of an alloy such as silicon germanium, lead tellurium, bismuth tellurium, cobalt antimony, and the like. Additionally, the number of the thermoelectric converter element couples 13 contained in the electric power generating module serving as the electric power generation unit is not limited to 10, and therefore the number may be a desirable number as occasion demands. The number of the electric power generating modules is not limited to 100, and therefore the number is set to a desirable number as occasion demands. Additionally, concerning the shape of the thermoelectric generator 2b, the generator of the flat shape is shown in FIG. 2; however, the shape is not limited to that, and therefore the generator may be cylindrical to be fitted to the exhaust gas pipe of the engine or may be box-shaped to be fitted to a catalytic converter if the generator is installed near the catalytic converter.

Figure 3:
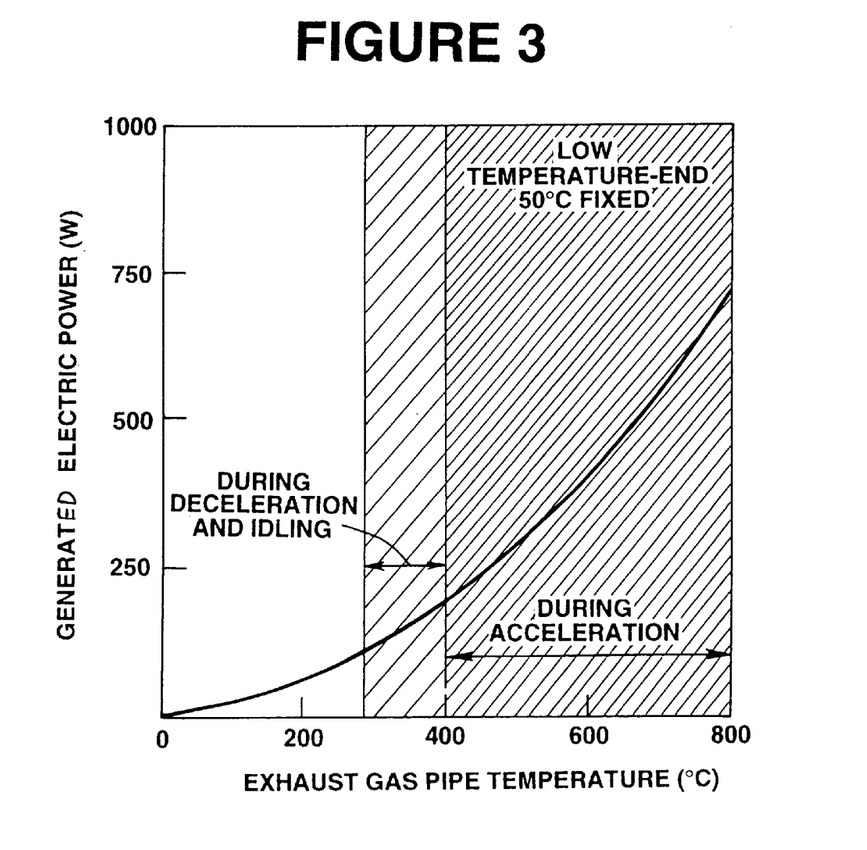
FIG. 3 is a graph of electric power generation characteristics of the thermoelectric generator forming part of the electric energy supply system of a vehicle, according to an embodiment of the present invention.

As shown in FIG. 3, under an idling condition of the engine, the exhaust gas heat of the engine is less so that the temperature of the exhaust gas pipe is about 300° C. to 400° C. at a position near and downstream of the catalytic converter located under a vehicle floor. Additionally, the temperature of the exhaust gas pipe at a position near and downstream of an exhaust manifold of the engine is higher than the above and is about 400° C. to 600° C.

When the thermoelectric generator 2b is installed on the exhaust gas pipe located in an under-floor region of the vehicle, there is the possibility of causing a capacity shortage for supplying about 200 to 300 W which is steadily required in the vehicle, under the idling condition.

In contrast, during acceleration or the like of the vehicle, the temperature of the exhaust gas pipe rises to about 400° C. to 800° C., so that it is possible to sufficiently supply an electric power required in the vehicle, only by the thermoelectric generator 2b.

It is possible to constitute the thermoelectric generator by providing more thermoelectric converter elements in order to compensate an electric power shortage in case the exhaust gas pipe is low in temperature. However, it is preferable that the number of the elements are approximately the earlier described number from the view point of installing the generator on the vehicle.

By providing a voltage converting function to the thermoelectric generator 2b, a setting is made to always obtain the maximum electric power generating efficiency thereby attaining a higher thermoelectric generation efficiency.

In the case where the voltage of the storage battery 6 is higher than that of this thermoelectric generator 2b under a condition in which the temperature of the exhaust gas pipe is low immediately after engine starting, the current stored in the storage battery 6 flows in a reverse direction toward the thermoelectric generator 2b. A function for preventing this occurrence is incorporated in the electric power control unit 3, in certain embodiments.

The turbine generator 2a for generating electric power by using kinetic energy of exhaust gas may be employed as the exhaust gas electric power generation unit 2. A schematic depiction of a turbine generator 2a installed in an exhaust gas pipe 20 is provided in FIG. 4. In certain embodiments, the turbine generator 2a is a so-called induction generator which generates an induced current under rotation of a rotatable shaft of the turbine upon impingement of exhaust gas against the turbine blades. In this case, its installation location is preferably positioned as upstream in the exhaust gas pipe 20 as possible or near the exhaust manifold 22. In other words, by disposing the turbine generator 2a as near to the engine as possible, it is possible to effectively utilize high speed exhaust gas or exhaust gas high in kinetic energy, thereby accomplishing highly efficient electric power generation.

Figure 4:
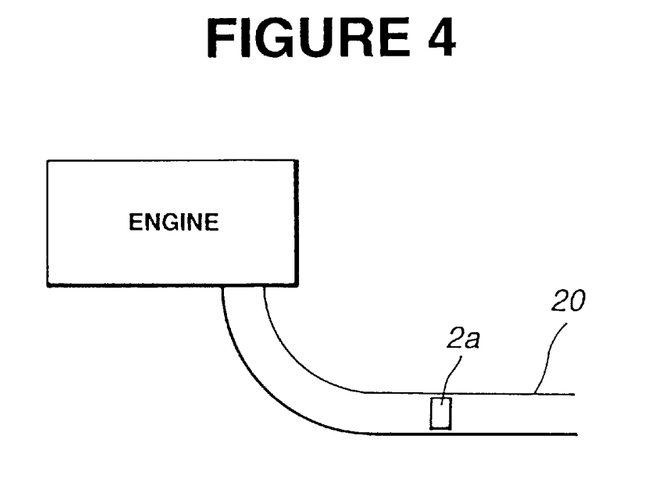
FIG. 4 is a schematic view of a turbine generator forming part of the electric energy supply system of a vehicle, according to another embodiment of the present invention.

Since the kinetic energy of exhaust gas is utilized, the energy of exhaust gas can be effectively utilized regardless of the temperature of exhaust gas as compared with the above-mentioned thermoelectric generator 2b, because high speed exhaust gas can be obtained in a running mode at a high engine speed even under a low temperature condition immediately after engine starting.

Controlling the amount of electric power generated by the turbine generator 2a is made possible by controlling the induced current of the turbine generator similarly to that of the alternator.

The current obtained by the turbine generator 2a is alternating, and therefore it is necessary to rectify the current to obtain a constant-voltage in order to convert the current to electric power which can be used for the vehicle, as is done in the case of the alternator. Accordingly, this function may be incorporated in the electric power control unit 3.

The driving condition judgment unit 4 serving as the driving condition judging means for the vehicle, forming part of this system will be explained. The driving condition judgement unit 4 is arranged as follows. Detection sensors 26 are provided that detect respectively, for example, the speed of the vehicle, acceleration of the vehicle, engine speed, a depression amount of an accelerator pedal, a depression amount of a brake pedal, a gear position of a transmission, a combustion condition (for example, a combustion chamber temperature, presence or absence of knocking and the like), an exhaust gas temperature, an intake air temperature, a fuel supply amount, an outside air temperature, atmospheric pressure, and fluctuating values of these conditions. The information obtained by one or more of these detection sensors are judged to decide in which mode (i.e., a stopping (idling) mode, a starting or acceleration mode, a constant speed running mode, a deceleration mode) the vehicle is currently operating.

The electricity storage condition judgment unit 5, which can serve as the electricity storage condition judging means, judges the electricity storage condition, for example, in accordance with the voltage (V) of the storage battery 6, input and output current (I), the temperature of the storage battery and other factors.

Here, I>0 means the output of current from the storage battery, while I<0 means the input of current to the storage battery. Additionally, a voltage which makes it possible to restart the engine during cold time is required as a lowest voltage Vmin of the storage battery. In case of the storage battery of the 12 volt system, this value is about 10.5 V. A highest voltage Vmax if the storage battery is fully charged is about 13.5 V to 15 V for a storage battery in a 12 V system.

The lowest voltage Vmin and highest voltage Vmax depend on the outside air temperature and the deterioration condition of the storage battery 6 itself, and therefore a further suitable control for the electric power is made possible by changing a set value (not only the above-mentioned voltage value) in accordance with conditions. The deterioration condition of the storage battery is judged by measuring the value of the voltage (V) and the value of the current (I).

Although the electric power control unit 3, the driving condition judgement unit 4 and the electricity storage condition judgment unit 5 which are connected between the electric power generating means 1, 2 and the electric load 7 of the vehicle have been shown in FIG. 1 as being disposed separate from each other, these functions of these units 3, 4, 5 are combined into an integral unit at one location, in certain embodiments. Each unit 3, 4, 5 or a combined unit, may be realized by control logic or a suitable processing device, as is known in the art.

The operation of the electric energy supply system according to this embodiment for a system applied to an automotive vehicle will be discussed with reference to Table 1. Table 1 shows an example of controlling the operative state (ON) and the inoperative state (OFF) of the power output shaft electric power generation unit 1 and the exhaust gas electric power generation unit 2, these units 1, 2 serving as electric power generating means under the control of the electric power control unit 3. The control of electric power generator is made in accordance with the value of the terminal voltage (V) and the current (I) of the storage battery 6, obtained by the electricity storage condition judgment unit 5, for example, in each of the four modes, i.e., the stopping (idling) mode, the acceleration mode, the constant speed running mode, and the deceleration mode. The four modes are judged (i.e., determined) by the driving condition judgement unit 4 of the vehicle.

TABLE 1

| Vehicle Driving Condition | Electricity Storage Condition | | Electric Power Generating Means Operating Condition | |
|---|---|---|---|---|
| | Voltage | Current | Power Output Shaft Electric Power Generation Unit | Exhaust Gas Electric Power Generation Unit |
| Stopping (During Idling) | V = Vmax | I > 0 | OFF | OFF |
| | Ditto | I < 0 | OFF | OFF |
| | Vmin < V < Vmax | I > 0 | OFF | ON |
| | Ditto | I < 0 | OFF | ON |
| | V < Vmin | I > 0 | ON | ON |
| | Ditto | I < 0 | ON | ON |
| Acceleration | V > Vmax | I > 0 | OFF | OFF |
| | Ditto | I < 0– | OFF | OFF |
| | Vmin < V < Vmax | I > 0 | OFF | ON |
| | Ditto | I < 0 | OFF | ON |
| | V < Vmin | I > 0 | ON | ON |
| | Ditto | I < 0 | OFF | ON |
| Constant Speed | V > Vmax | I > 0 | OFF | OFF |
| | Ditto | I < 0 | OFF | OFF |

TABLE 1-continued

| Vehicle Driving Condition | Electricity Storage Condition | | Electric Power Generating Means Operating Condition | |
|---|---|---|---|---|
| | Voltage | Current | Power Output Shaft Electric Power Generation Unit | Exhaust Gas Electric Power Generation Unit |
| Running | Vmin < V < Vmax | I > 0 | OFF | ON |
| | Ditto | I < 0 | OFF | ON |
| | V < Vmin | I > 0 | ON | ON |
| | Ditto | I < 0 | OFF | ON |
| Deceleration | V > Vmax | I > 0 | OFF | OFF |
| | Ditto | I < 0 | OFF | Off |
| | Vmin < V < Vmax | I > 0 | ON | ON |
| | Ditto | I < 0 | OFF | ON |
| | V < Vmin | I > 0 | ON | ON |
| | Ditto | I < 0 | ON | ON |

First, to start the vehicle, a key switch is turned ON to start the engine. At this time, electric power is supplied from the storage battery 6 to a starter to accomplish engine starting. A current to be used here is around 300 to 500 A at ordinary temperature in a general passenger car, though it depends on the capacity of the starter. The current to be required for engine starting increases owing to viscosity increase or the like of lubricating oil in the engine as ambient temperature lowers. The idling (stopping) condition is detected after the engine starts.

The electricity storage condition of the storage battery at the engine starting is judged by the electricity storage condition judgement unit 5 and in accordance with the terminal voltage (V). The information signal relating to the storage condition is transmitted to the electric power control unit 3.

When the voltage value (V)=Vmax, the electric power required for the vehicle is sufficient, and therefore the output shaft electric power generation unit 1 and the exhaust gas electric power generation unit 2 are not operated and therefore put into the inoperative state (OFF) regardless of the magnitude of the current value (I). When the voltage value (V) is Vmax>V>Vmin, only the exhaust gas electric power generation unit 2 is put into the operative state (ON) by the electric power control unit 3 regardless of the magnitude of the current value (I). When the voltage value (V) is V<Vmin, the output shaft electric power generation unit 1 is also operated regardless of the magnitude of the current value (I) to compensate for the shortage in charged amount of the storage battery 6, thus compensating for the amount which cannot be supplied only by the exhaust gas electric power generation unit 2. This condition continues under the idling condition in which the vehicle is stopped, made immediately after the engine starting.

Under a condition in which the vehicle is started and accelerated, the vehicle speed, the acceleration, the depression amount of the acceleration pedal, and the like are detected by the detection sensors 26. The detected information signals are transmitted to the driving condition judgement unit 4. The driving condition judgment information (i.e., the information representing that the vehicle is in the starting and acceleration mode) obtained under this driving condition judgment is transmitted to the electric power control unit 3.

Under this running condition ("acceleration" in Table 1), when the voltage value (V) judged by the electricity storage condition judgement unit 5 is V>Vmax, the electric power required for the vehicle is sufficient and therefore both the output shaft electric power generation unit 1 and the exhaust gas electric power generation unit 2 are controlled to be put into the inoperative state (OFF) under the action of the electric power control unit 3, regardless of the magnitude of the current value (I). When the voltage value (V) is Vmax>V>Vmin, only the exhaust gas electric power generation unit 2 is controlled to be put into the operative condition (ON) under the action of the electric power control unit 3, regardless of the magnitude of the current value (I). When the storage amount of electricity is insufficient so that V<Vmin and I>0, not only the exhaust gas electric power generation unit 2 but also the output shaft electric power generation unit 1 are operated (ON). In this state, it is possible that the necessary electric power is supplied to the vehicle due to the exhaust gas electric power generation unit 2 during the acceleration of the vehicle, and therefore the amount of electric power generated by the alternator 1 is suppressed by the electric power control unit 3 to such a minimum value as to prevent the storage battery 6 from being put into a discharged state. When the voltage value (V) is V<Vmin and the current value (I) is I<0, only the exhaust gas electric power generation unit 2 is controlled to be put into the operative condition (ON) while the alternator 1 is controlled to be put into the inoperative condition (OFF), under the action of the electric power control unit 3.

The term "during acceleration" of the automotive vehicle as used here means a high load operating condition of the engine, so that a condition where the vehicle is accelerated in a non-depression state of the accelerator on a downhill slope, for example, included in the deceleration mode.

After the vehicle is accelerated and reaches a desired speed to be put into the constant speed running mode, the vehicle speed, the depression amount of the accelerator pedal, and other parameters are similarly detected by the detection sensors 26. The detected information signals are transmitted to the driving condition judgment unit 4. The driving condition judgment information (i.e., the information representing that the vehicle is in the constant running mode) obtained by this driving condition judging is transmitted to the electric power control unit 3.

Under this running condition, when the voltage value (V) judged by the electricity storage condition judgement unit 5 is V>Vmax, the electric power required for the vehicle is sufficient and therefore both the output shaft electric power generation unit 1 and the exhaust gas electric power generation unit 2 are controlled to be put into the inoperative state (OFF) under the action of the electric power control unit 3, regardless of the magnitude of the current value (I). When the voltage value (V) is Vmax>V>Vmin, only the exhaust gas electric power generation unit 3 is controlled to be put into the operative state (ON) under the action of the electric power control unit 3, regardless of the magnitude of the current value (I).

When the storage amount of electricity is insufficient so that V<Vmin and I>0, i.e., in a condition in which current is output from the storage battery 6 toward the load 7, not only the exhaust gas electric power generation unit 2 but also the output shaft electric power generation unit 1 are operated (ON). In this case, the amount of electric power generated by the output shaft electric power generation unit 1 is controlled in such a manner that the current value (I) of the storage battery 6 becomes I=0, under the action of the electric power control unit 3.

Furthermore, when the voltage value (V) is V<Vmin and the current value (I) is I<0, i.e., in a condition where the current is input toward the storage battery 6, only the exhaust gas electric power generation unit 2 is controlled to be put into the operative state (ON) while the output shaft electric power generation unit 1 is controlled to be put into the inoperative state (OFF).

When the vehicle is in a decelerated running condition, desired parameters of the vehicle speed, the acceleration, the depression amount of the accelerator pedal, the depression amount of the brake pedal, the fuel supply amount, the engine speed and other parameters are similarly detected by the detection sensors 26. The detected information signals are transmitted to the driving condition judgment unit 4. The driving condition judgment information (i.e., the information representing that the vehicle is in the deceleration mode) is transmitted to the electric power control unit 3.

Under this running condition, when the voltage value (V) judged by the electricity storage condition judgment unit 5 is V>Vmax, both the output shaft electric power generation unit 1 and the exhaust gas electric power generation unit 2 are controlled to be put into the inoperative condition (OFF) by the electric power control unit 3.

Additionally, when the voltage value (V) is Vmax>V>Vmin and the current value (I) is I>0, i.e., in a condition where current is output from the storage battery 6 to the load 7, the exhaust gas electric power generation unit 2 is controlled to be put into the operative state (ON) and the output shaft electric power generation unit 1 is operated (ON). This is done for the following reasons. The energy amount of exhaust gas is low during the deceleration similar to stopping of the vehicle so that the electric power obtained only from the exhaust gas electric power generation unit 2 is insufficient. Therefore, the electric power control unit 3 controls in such a manner that the electric power generation by the output shaft electric power generation unit 2 becomes the maximum so as to put the storage battery 6 into the fully charged state.

Furthermore, when the voltage value (V) is Vmax>V>Vmin and the current value (I) is I<0, i.e., in a condition where current is input toward the storage battery 6, the output shaft electric power generation unit 1 is controlled to be put into the inoperative state (OFF) so that no electric power generation by this unit is accomplished, while only the exhaust gas electric power generation unit 2 is controlled to be put into the operative state (ON).

Furthermore, when the voltage value (V) is V<Vmin, the charged amount of the storage battery 6 is insufficient, and therefore both the output shaft electric power generation unit 1 and the exhaust gas electric power generation unit 2 are controlled to be put into the operative state (ON) by the electric power control unit 3. Under this condition, the kinetic energy during vehicle running is recovered as electric power.

The programming of the electric power control unit 3 to control the ON/OFF states of the power output shaft electric power generation unit 1 and the exhaust gas electric power generation unit 2 is readily accomplished by one of skill in the art, given Table 1 as provided.

In case of using the thermoelectric generator 21b as the exhaust gas electric power generation unit of the above-mentioned system, the output electric power generated by the generator 2b can be previously calculated in accordance with the heat quantity of exhaust gas passing through the exhaust gas pipe, the flow speed of the exhaust gas, the heat quantity emitted to the atmospheric air, the high temperature-end temperature and the low temperature-end temperature of the thermoelectric generator 2b, and other parameters. Accordingly, an abnormality and a deterioration condition of the thermoelectric generator 2b can be detected by the difference between this calculated output electric power and an actual output electric power. By adding detecting means 30 for this (FIG. 2), electric power supply is changed over to be provided by the output shaft electric power generation unit 1 under the action of the electric power control unit 3. This is done, for example, when the thermoelectric generator loses its electric power generating ability arises, thereby ensuring an electric power supply to the vehicle. This makes the electric energy supply system of the present invention further practical and highly reliable.

Although an exemplary embodiment has been described in which the electric energy supply system of the present invention is mounted on a gasoline-fueled engine, the present invention is not limited to utilizing the exhaust gas energy emitted from gasoline-fueled engines and therefore is also effective for utilizing exhaust gas energy of a diesel engine. In an electric vehicle using an electric motor as a driving source, heat generation from the electric motor during the starting, acceleration and the like of the electric vehicle can be utilized as a heat source, thereby similarly making it possible to effectively utilize energy. Additionally, the vehicle to which the electric energy supply system of the present invention is applied is not limited to automotive vehicles, and therefore can be applied to motorcycles and other vehicles similar to them.

In the exemplary embodiment, there arises an electric power generation amount-excessive condition in which the voltage value (V) becomes V>Vmax during the acceleration and running of the vehicle, in which such an excessive electric power is not effectively utilized. Accordingly, in order to effectively utilize this excessive electric power, the output shaft electric power generation unit 1 such as the alternator itself is arranged as a prime mover having an electric power generating function, or separately providing a prime mover, thereby making it possible to reduce engine load during acceleration and running. This improves acceleration performance and fuel economy of the vehicle.

When the thermoelectric generator 2b is the exhaust gas electric power generation unit 2, it is possible to positively control the temperature of exhaust gas by using the Peltier effect of the generation unit. For example, when the thermoelectric generator 2b is disposed upstream of a catalytic converter, exhaust gas is heated by supplying electric power to the thermoelectric generator 2b in a condition where the temperature of the catalytic converter is low and the temperature of the exhaust gas is low. This enhances a reaction ability of a catalyst thus making it possible to enhance an exhaust gas purification performance.

In a high load operating condition in which the temperature of exhaust gas is considerably high, it is possible to lower and suitably control the temperature of exhaust gas by utilizing the Peltier effect. This can improve the reliability of an exhaust system.

Although the present invention has been described and illustrated in detail, it is to be clearly understood that the same is by of illustration and example only and is not to be taken by way of limitations, the spirit and scope of the present invention being limited only by the terms of the appended claims.

What is claimed is:

1. An electric power control system for a vehicle, comprising:

an internal combustion engine for driving vehicle, the engine having an exhaust gas passage;

an electric load disposed in the vehicle;
a first electric generator driven by kinetic energy output from a power output shaft of the engine, the first electric generator comprising an alternator mechanically driven by the engine;
a second electric generator driven by energy of exhaust gas from the engine, the second electric generator comprising a thermoelectric converter that generates electricity from energy of engine exhaust gas, the thermoelectric converter being disposed in the exhaust gas passage so as to be exposed to exhaust gas flowing therethrough;
a storage battery;
an electric line connecting the electric load, the first and the second electric generators and the battery to conduct the electric power therebetween;
an electricity storage condition judgment unit that determines a charge condition of the storage battery in accordance with both voltage of the storage battery and one of input of current to and output of current from the storage battery;
a driving condition judgment unit that determines the driving condition of the vehicle; and
an electric power control unit, coupled to the electricity storage condition judgment unit and the driving condition judgment unit, the electric power control unit controlling both the first electric generator and the second electric generator as a function of the determined storage condition of the battery and the determined driving condition of the vehicle in such a manner that the first electric generator and the second electric generator are activated under different conditions.

2. The electric power control system of claim 1, wherein the electric power control unit is configured to activate the second electric generator unless the battery is charged at least to a specified level.

3. The electric power control system of claim 2, wherein the electric power control unit is configured to stop the first electric generator when the electric load is large and the storage battery is discharging electricity.

4. The electric power control system of claim 3, wherein the electric power control unit is configured to activate the first and second electric generators when the vehicle is running in a high load condition.

5. The electric power control system of claim 4, wherein the high load condition is acceleration of the vehicle.

6. The electric power control system of claim 5, wherein the electric power control unit is configured to activate the second electric generator to generate a substantially maximum electric power, and activate the first electric generator to add auxiliary power.

7. The electric power control system of claim 6, wherein the electric power control unit is configured to activate the first electric generator to generate more electric power when the determined driving condition indicates that the load of the vehicle is light and less electric power when the load of the vehicle is heavy.

8. The electric power control system of claim 7, wherein the electric power control unit is configured to activate the first electric generator and the second electric generator when the charge of the battery is below a specified level.

9. The electric power control system of claim 8, wherein the electric power control unit is configured to prohibit operation of the first and second electric generators when the battery is charged at least to a specified level.

10. An electric energy supply system for a vehicle, comprising:

a plurality of electric power generating units for generating electric power by utilizing, different energies which are derived from a driving source for driving the vehicle, including at least a first electric power generator driven by kinetic energy output from a power output shaft of the engine and a second electric generator driven by energy of exhaust gas from the engine, the driving source including an internal combustion engine, the plurality of the electric power generating units including an alternator for generating electric power by utilizing a power energy mechanically obtained from the internal combustion engine, and an exhaust gas electric power generator for generating electric power by utilizing exhaust gas energy of the internal combustion engine, the exhaust gas electric power generating unit being a thermoelectric generator for generating electric power by utilizing the heat energy of exhaust gas discharged from the internal combustion engine;
an electricity storing device for storing electric energy;
a driving condition judging unit for judging a driving condition of the vehicle;
an electricity storage condition judging unit for Judging an electricity storage condition within the electricity storing unit; and
an electric power control unit for controlling a supply amount of electric energy to be used in the vehicle, by controlling an amount of electric power generated by each of the plurality of the electric power generating units in accordance with information received from the driving condition judging unit and the electricity storage condition judging unit.

11. The electric energy supply system of claim 10, wherein the electric power control unit is configured to operate the exhaust gas electric power generating unit as a main generating source to generate electric power and to supply an electric energy obtained by this electric power generation to the electricity storing device and to an electric power load within the vehicle, when the vehicle is in an acceleration condition as detected by the driving condition judging unit.

12. The electric energy supply system of claim 11, wherein the electric power control unit is configured to operate the alternator as a main generating source to generate electric power and to supply an electric energy obtained by this electric power generation to the electricity storing unit and to an electric power load within the vehicle, when the vehicle is in an acceleration condition as detected by the driving condition judging unit.

13. The electric energy supply system of claim 12, further comprising a detecting unit for detecting an electric power generating ability of the exhaust gas electric power generating unit, and in that the electric power control unit is configured to operate the power output shaft electric power generating unit as a main generating source when the electric power generating ability detected by the detecting device is equal to or less than a predetermined level.

14. An electric power control system for a vehicle, comprising:
an internal combustion engine for driving the vehicle, the engine having an exhaust gas passage through which exhaust gas from the engine flows;
an electric load disposed in the vehicle;
a first electric generator driven by kinetic energy output from a power output shaft of the engine, the first electric generator being an alternator driven by revolution of the engine;

a second electric generator driven by energy of exhaust gas from the engine, the second electric generator being a thermoelectric converter that generates electricity from energy of engine exhaust gas, the thermoelectric converter being operatively disposed in the exhaust gas passage;

a storage battery;

an electric line connecting the electric load, the first and the second electric generators and the battery to conduct the electric power therebetween;

an electric storage condition judgment unit that determines a change condition of the storage battery in accordance with both voltage of the storage battery and one of input of current to and output to current from the storage battery;

a driving condition judgment unit that determines the driving condition of the vehicle; and an electric power control unit, coupled to the electricity storage condition judgment unit and the driving condition judgment unit, the electric power control unit controlling both the first electric generator and the second electric generator as a function of the determined storage condition of the battery and the determined driving condition of the vehicle in such a manner the first electric generator is deactivated while the second electric generator is activated, in accordance with the determined driving condition of the vehicle.

* * * * *